United States Patent [19]

Matsusako

[11] Patent Number: 5,017,918
[45] Date of Patent: May 21, 1991

[54] METHOD AND CIRCUIT FOR ELIMINATING MAJOR BIT TRANSITION ERROR AT THE BIPOLAR ZERO POINT IN A DIGITAL-TO-ANALOG CONVERTER

[75] Inventor: Kyoji Matsusako, Hadano, Japan

[73] Assignee: Burr-Brown Corporation, Tucson, Ariz.

[21] Appl. No.: 499,099

[22] Filed: Mar. 26, 1990

[51] Int. Cl.⁵ .............................................. H03M 13/00
[52] U.S. Cl. ..................................... 341/118; 341/145
[58] Field of Search .............. 341/118, 145, 154, 138, 341/120, 144, 121, 146, 127

[56] References Cited

U.S. PATENT DOCUMENTS

| | | | |
|---|---|---|---|
| 4,412,208 | 10/1983 | Akazawa et al. | 340/347 |
| 4,465,996 | 8/1984 | Boyacigiller et al. | 341/118 |
| 4,468,652 | 8/1984 | Wang et al. | 341/118 |
| 4,488,144 | 12/1984 | Wollman | 341/118 |
| 4,490,714 | 12/1984 | van de Plassche et al. | 340/347 |
| 4,567,463 | 1/1986 | Naylor | 340/347 |
| 4,568,917 | 2/1986 | McKenzie et al. | 341/118 |

FOREIGN PATENT DOCUMENTS 3215519 4/1982 Fed. Rep. of Germany.

Primary Examiner—William M. Shoop, Jr.
Assistant Examiner—Brian Young
Attorney, Agent, or Firm—Cahill, Sutton & Thomas

[57] ABSTRACT

A digital-to-analog converter converts a digital word of M+N bits to an analog signal with reduced bit switching error, by providing a first group of M input conductors conducting the M most significant bits of the digital word, a second group of N input conductors conducting the N least significant bits of the digital word, and an M bit plus 1 adder having M inputs connected to a corresponding conductor of the first group. A signal representative of the most significant bit of the digital input word is coupled to an input of the adder. The adder has M output conductors. Signals on the N input conductors of the second group together with signals on the M output conductors from an intermediate digital word of M+N bits differ in value from the first digital word. An M+N bit DAC receives the intermediate digital word and produces an analog current corresponding to the value of the intermediate digital word. A switched current source responsive to the most significant bit of the digital input word produces an offset current and algebraically sums it with the analog current to produce an analog output current. The offset current has a value equal in magnitude and opposite in polarity to the shift in the analog current produced by the coupling of the most significant bit of the digital input word to the input of the adder such that the analog output current corresponds to the value of the first digital word.

12 Claims, 1 Drawing Sheet

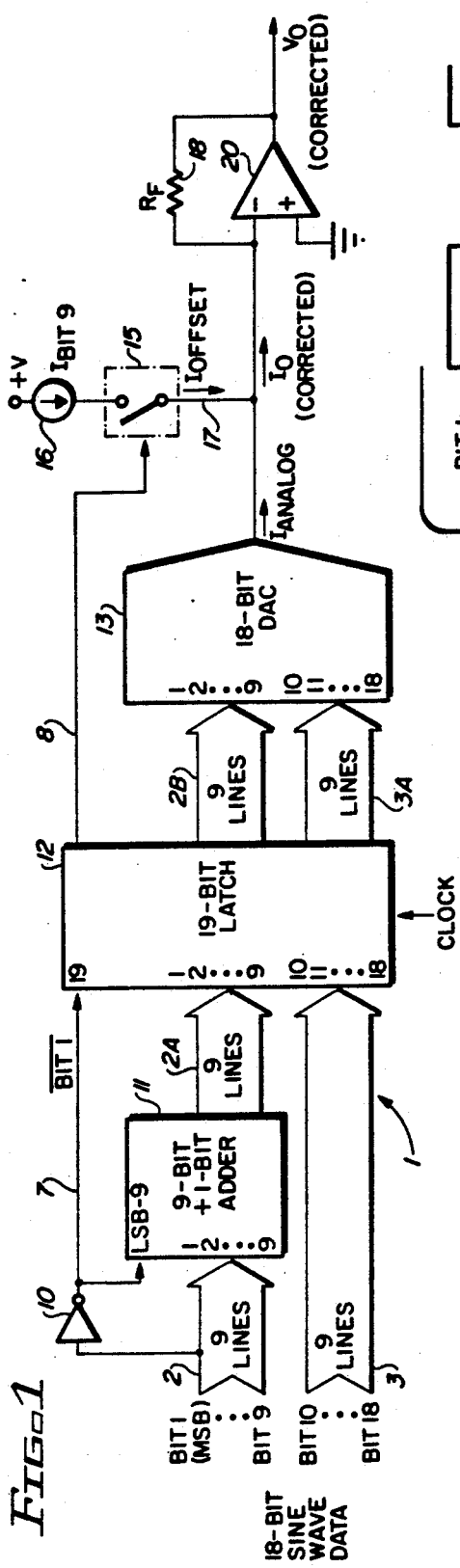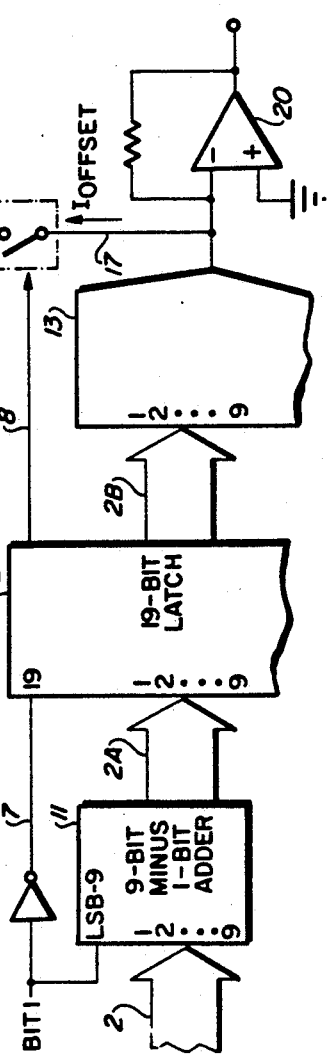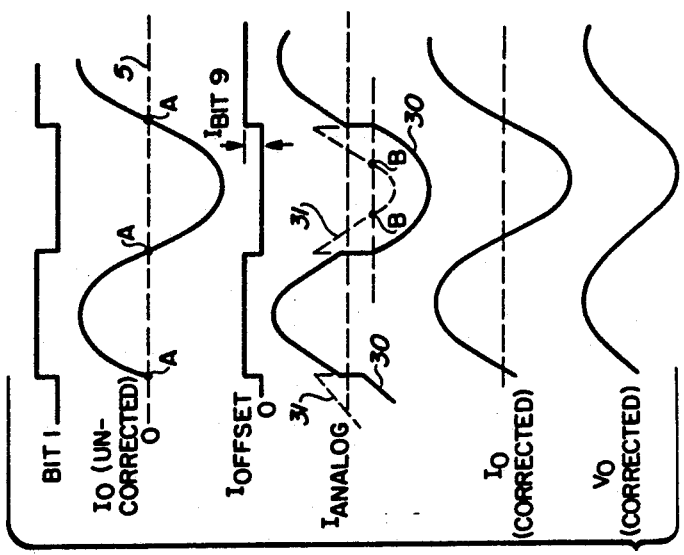

METHOD AND CIRCUIT FOR ELIMINATING MAJOR BIT TRANSITION ERROR AT THE BIPOLAR ZERO POINT IN A DIGITAL-TO-ANALOG CONVERTER

BACKGROUND OF THE INVENTION

The invention relates to techniques for eliminating noise occurring near the bipolar zero point of a digital-to-analog converter, and more particularly to techniques for eliminating major bit transition errors at the bipolar zero point.

Eighteen bit digital-to-analog converters are being used to manufacture digital audio equipment. In digital audio equipment, audio information is stored not in the form of analog signals, but in the form of binary words which represent the polarity and amplitude of selected points of sine waves being represented in digital form. BIT1 (the most significant bit) conventionally represents the polarity of the sine wave data and BITS 2-18 represent the amplitude of the sine wave.

The most significant bit (MSB) switches at the points indicated by "A" in FIG. 2. The error produced by switching of the MSB (i.e., BIT1) is the largest switching error of a digital-to-analog converter. It is very inconvenient to have this error occur at the points labeled "A", which is the bipolar zero (BPZ) point of the digital-to-analog converter, because the error is a very large percentage of the smallest audio signals, which occur around bipolar zero. This causes discernable hissing and distortion in the audio output signal produced by the digital-to-analog converter.

In the closest prior art of which the applicant is aware, the digital sine wave data is "shifted" by adding a "1" to a certain bit, for example bit 9, of each input audio word, so that the points "A" in FIG. 2 will not occur at the bipolar zero level represented by the horizontal dotted line 5 in FIG. 2. This reduces the hissing and distortion that occur as a result of the MSB switching. However, digital shifting of the sine wave data is not a completely satisfactory solution to the problem because such shifting produces a digital "overload" if the input is at a "full scale" value, i.e. when the input consists of all "1"s. It is necessary to prevent such a digital overload from occurring, since it causes severe distortion in the analog output. This requirement prevents applying of a "full scale" input of all "1"s to the DAC. Some of the dynamic range of the digital-to-analog converter therefore is lost.

SUMMARY OF THE INVENTION

Accordingly, it is an object of the invention to provide a circuit and technique which avoids the shortcomings of major bit shifting techniques for reducing zero point noise in a digital-to-analog converter.

It is another object of the invention to reduce zero point noise in a digital-to-analog converter without reducing the dynamic range thereof.

It is another object of the invention to reduce or avoid low level linearity errors resulting from major bit transitions.

Briefly described, and in accordance with one embodiment thereof, the invention provides a digital-to-analog converter for converting a digital input word of M+N bits to an analog signal with reduced major bit switching error. The digital-to-analog converter includes a first group of M input conductors conducting the M most significant bits of the digital input word, a second group of N input conductors conducting the N least significant bits of the digital input word, an M bit plus 1 adder having M inputs each connected to a conductor of the first group, respectively, and circuitry for coupling a signal representative of the most significant bit of the digital input word to a certain input of the adder. The adder has M output conductors. The signals on the N input conductors of the second group together with signals on the M output conductors from an intermediate digital word of M+N bits differing in value from the first digital word. An M+N bit DAC receives the intermediate digital word and produces a first analog current corresponding to the value of the intermediate digital word. A switched current source responsive to the most significant bit of the first digital word produces an offset current that is algebraically summed with the first analog current to produce an analog output current. The offset current has a value such that the analog output current corresponds precisely to the value of the first digital word.

BRIEF DESCRIPTION OF THE DRAWINGS

FIG. 1 is a block diagram of the digital-to-analog converter of the present invention.

FIG. 2 is a timing diagram useful in describing the invention and the problems of the prior art.

FIG. 3 is a partial block diagram of an alternate embodiment of the invention of FIG. 1.

DETAILED DESCRIPTION OF THE PREFERRED EMBODIMENT

In FIG. 1, an 18 bit digital-to-analog converter circuit 1 is shown. It includes a "9 bit+1 bit adder 11, a 19 bit latch 12 clocked by a sample frequency CLOCK, an 18 bit DAC (digital-to-analog converter), a current-to-voltage converter including operational amplifier 20 and a feedback resistor 18, and a switched current source including constant current source 16 and switch 15.

Adder 11 adds the inverted value of the incoming MSB at a weight equivalent to the least significant of the nine bits to the input nine bit value. For example, if the incoming MSB is "0", a number equal to the least significant bit is added.

An 18 bit word representing audio sine wave data includes a group of 9 most significant bits applied by 9 lines 2 to the corresponding inputs of the 9 bit portion of adder 11. The 9 least significant bits of the sine wave data are applied by 9 lines 3 to corresponding inputs of 19 bit latch circuit 12. The most significant bit, namely BIT1 is connected to the input of an inverter 10, the output of which is connected by conductor 7 to the 1 bit portion of adder 11, and also to one input of 19 bit latch 12. The 9 outputs 2A of 9 bit+1 bit adder 11 are connected to 9 corresponding inputs of 19 bit latch 12. The output of latch 12 corresponding to conductor 7 is connected by conductor 8 to a control electrode of switch 15. The other 18 bit outputs of 19 bit latch circuit 12 are connected to corresponding inputs of 18 bit DAC 13 by a group 2B of 9 conductors corresponding to a 9 conductors 2A and a group 3A of 9 conductors corresponding to input conductors 3.

The output of DAC 13 is connected by conductor 17 to one terminal of switch 15, the other terminal of which is connected to receive the constant current $I_{BIT9}$ supplied by constant current source 16. Conductor 17 also is connected to the inverting input of operational amplifier 20, the noninverting input of which is connected to ground. Feedback resistor 18 is connected between the output terminal $V_0$ and conductor 17 so that the net analog current produced in conductor 17 is converted to the output voltage $V_0$(CORRECTED). Thus, the most significant 9 bits of the audio sine wave data are applied to 9 inputs bit adder 11, and the MSB is inverted and used to "digitally shift" the MSB portion of the sine wave input data. The output of inverter 10 also is used to control switched analog current source 15,16 which is applied to the LSB input of the nine bit plus one bit adder 11. Note that the nine bit plus one bit adder will never overload because BIT1, the MSB, is always zero when addition occurs.

The output of the top bit of 19 bit latch 12 is applied by conductor 8 to the control terminal of switch 15 that switches constant current $I_{BIT9}$ into the DAC output conductor 17. Switch 15 connects the current source 16 to conductor 17 when BIT1 is at a "0" state.

The magnitude of the constant current $I_{BIT9}$ is selected so as to produce an offset current $I_{OFFSET}$ with the same value that would be produced by DAC 13 at its output if BIT9 is at a "1" state and all of the other bits are at a "0" state. Thus, in accordance with the invention, the above-mentioned digital bit shifting occurs by virtue of the MSB bit, namely BIT1, being applied to 9 bit+1 bit adder 11. Thus, selective switching of $I_{BIT9}$ to produce $I_{OFFSET}$ results in correction of a shift in the analog output current produced by the digital bit shifting, so that the output $V_0$ remains unchanged.

The current $I_{OFFSET}$ in FIG. 1 has the waveform indicated in FIG. 2, and is at a high level when BIT1 is a "1", and has the same magnitude but opposite polarity to the output current shift caused by BIT9 digital offset introduced by nine bit plus one bit adder 11 into the output current produced by 18 bit DAC 13.

In the $I_{ANALOG}$ waveform of FIG. 2, the dotted line segments 31 indicate the half cycle shift in the output current produced by DAC 13 as a result of the above digital shift of the 18 bit audio sine wave data produced by nine bit plus one bit adder 11. The solid line segments 30 in FIG. 2 indicate the offsetting "analog" shift in the analog current, resulting from summing of the output current produced by DAC 13 with the switched current $I_{BIT}$. Obviously, the "analog" shift 30 is equal and opposite to, and therefore compensates the "digital" shift 31, so the net effect is a normal appearing sine wave.

Alternately, the analog current could be added and the digital shift could be subtracted. FIG. 3 shows such an arrangement, in which the current source 16A causes $I_{OFFSET}$ to flow out of, rather than into, the output of DAC 13.

As a result, the MSB transitions actually occur at the points indicated by numerals "B" in FIG. 2, where they cause much less discernable distortion of the sine wave signal $V_0$ than is the case if the transitions caused by MSB switching occur at the bipolar zero points A as indicated in FIG. 2. The improvement of the present invention results in measurements of "total harmonic distortion plus noise" having values of about 0.6% with no digital "overload", and therefore no restriction in dynamic range of the digital input. The solid line of the $V_0$(CORRECTED) signal produced at the output of the circuit shown in FIG. 1 therefore avoids the overload condition.

While the invention has been described with reference to several particular embodiments thereof, those skilled in the art will be able to make the various modifications to the described embodiments of the invention without departing from the true spirit and scope of the invention. It is intended that all combinations of elements and steps which perform substantially the same function in substantially the same way to achieve the same result are within the scope of the invention.

What is claimed is:

1. A digital-to-analog converter for converting a first digital word of M+N bits to an analog signal with reduced major bit switching error, the digital-to-analog converter comprising in combination:
   (a) a first group of M input conductors conducting the M most significant bits of the first digital word;
   (b) a second group of N input conductors conducting the N least significant bits of the first digital word;
   (c) an M bit plus 1 bit adder having M inputs each connected to a conductor of the first group, respectively;
   (d) means for coupling a signal representative of the most significant bit of the first digital word to a certain input of the adder, the adder having M output conductors, signals on the N input conductors of the second group together with signals on the M output conductors of the adder comprising a second digital word of M+N bits differing in value from the first digital word;
   (e) an M+N bit DAC receiving the second digital word and producing a first analog current corresponding to the value of the second digital word;
   (f) a switched current source responsive to the most significant bit of the first digital word and producing an offset current and algebraically summing the offset current with the first analog current to produce a second analog current, the offset current having a value equal in magnitude and opposite in polarity to a shift in the first analog current due to the certain input of the adder, such that the second analog current corresponds to the value of the first digital word.

2. The digital-to-analog converter of claim 1 wherein the coupling means includes an inverter having an input connected to receive the most significant bit of the first digital word and an output connected to the certain input of the adder.

3. The digital-to-analog converter of claim 1 including a latch circuit having a plurality of inputs connected to the M output conductors and a plurality of inputs connected to the N input conductors of the second group and a plurality of outputs, respectively, to M+N inputs of the DAC.

4. The digital-to-analog converter of claim 3 wherein the latch is an M+N+1 bit latch, one bit of the latch being coupled to receive a signal representative of the most significant bit of the first digital word.

5. The digital-to-analog converter of claim 2 wherein the switched current source includes a constant current source and a switch connected in series with a constant source, the series switch being controlled in response to an output of the inverter.

6. The digital-to-analog converter of claim 2 wherein the switched current source includes a current-determining resistor with one terminal connected to an output of the DAC and another terminal connected to an output of the inverter.

7. The digital-to-analog converter of claim 1 wherein current of the switched current source flows into an output conductor of the DAC only during the shift in the first analog current.

8. The digital-to-analog converter of claim 1 wherein current of the switched current source flows out of an output conductor of the DAC only during the shift in the first analog current.

9. The digital-to-analog converter of claim 1 wherein M is equal to 9 and N is equal to 9, and wherein the certain input of the adder is the LSB bit input of the adder.

10. A method for converting a first digital word of M most significant bits and N least significant bits to an analog signal with reduced major bit switching error, the method comprising the steps of:
   (a) applying the M most significant bits to the M most significant bits of an M bit plus 1 bit adder;
   (b) applying a signal representative of the most significant bit to a certain input of the adder;
   (c) applying M outputs of the adder to M most significant bits of an M+N bit DAC and applying the N least significant bits to N least significant bits of the DAC;
   (d) operating the DAC to produce a first analog current corresponding to states of the M outputs of the adder and the N least significant bits, and operating a switched current source in response to the most significant bit to produce an offset current; and
   (e) algebraically summing the offset current with the first analog current to produce a second analog current, the 19 offset current having a value equal in magnitude and opposite in polarity to a shift produced in the first analog current resulting from the application of the most significant bit to a certain input of the adder, such that the second analog current corresponds to the value of the first digital word.

11. A digital-to-analog converter for converting a first digital word of M bits to an analog signal with reduced major bit switching error, the digital-to-analog converter comprising in combination:
   (a) a group of M input conductors conducting the first digital word;
   (b) an M bit plus 1 bit adder having M inputs each connected to the input conductors, respectively;
   (c) means for coupling a signal representative of the most significant bit of the first digital word to a certain input of the adder, the adder having M output conductors, signals on the M output conductors of the adder comprising a second digital word of M bits differing in value from the first digital word;
   (d) an M bit DAC receiving the second digital word and producing a first analog current corresponding to the value of the second digital word;
   (e) a switched current source responsive to the most significant bit of the first digital word and producing an offset current and algebraically summing the offset current with the first analog current to produce a second analog current, the offset current having a value equal in magnitude and opposite in polarity to a shift in the first analog current due to the certain input of the adder, such that the second analog current corresponds to the value of the first digital word.

12. A method for converting a first digital word of M bits to an analog signal with reduced major bit switching error, the method comprising the steps of:
   (a) applying the M bits to an M bit plus 1 bit adder;
   (b) applying a signal representative of the most significant bit to a certain input of the adder;
   (c) applying M outputs of the adder to M bits of an M bit DAC;
   (d) operating the DAC to produce a first analog current corresponding to states of the M outputs of the adder, and operating a switched current source in response to the most significant bit to produce an offset current; and
   (e) algebraically summing the offset current with the first analog current to produce a second analog current, the offset current having a value equal in magnitude and opposite in polarity to a shift produced in the first analog current resulting from the application of the most significant bit to a certain input of the adder, such that the second analog current corresponds to the value of the first digital word.

* * * * *